US008884438B2

(12) United States Patent
Gardner et al.

(10) Patent No.: US 8,884,438 B2
(45) Date of Patent: Nov. 11, 2014

(54) MAGNETIC MICROINDUCTORS FOR INTEGRATED CIRCUIT PACKAGING

(75) Inventors: Donald S. Gardner, Mountain View, CA (US); Larry E. Mosley, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 926 days.

(21) Appl. No.: 12/823,968

(22) Filed: Jun. 25, 2010

(65) Prior Publication Data

US 2010/0259911 A1 Oct. 14, 2010

Related U.S. Application Data

(63) Continuation-in-part of application No. 12/217,293, filed on Jul. 2, 2008, now Pat. No. 7,911,313.

(51) Int. Cl.

| | |
|---|---|
| ***H01L 23/48*** | (2006.01) |
| ***H01L 21/8242*** | (2006.01) |
| ***H01F 10/187*** | (2006.01) |
| ***H01F 41/04*** | (2006.01) |
| *H01F 17/00* | (2006.01) |
| *H01F 27/34* | (2006.01) |

(52) U.S. Cl.

CPC .... *H01F 17/0033* (2013.01); *H01F 2017/0066* (2013.01); *H01F 10/187* (2013.01); *H01F 2017/002* (2013.01); *H01F 27/34* (2013.01); *H01F 2017/0053* (2013.01); *H01F 41/046* (2013.01)

USPC .......... 257/774; 257/776; 257/786; 438/256; 438/262

(58) Field of Classification Search

CPC ............. H01L 21/76877; H01L 28/10; H01L 23/5384; H01L 23/5226; H01F 10/20; H01F 17/0006; H01F 17/0033; H01F 41/14; H01F 41/32

See application file for complete search history.

(56) References Cited

U.S. PATENT DOCUMENTS

| | | | | |
|---|---|---|---|---|
| 5,487,214 | A | 1/1996 | Walters | |
| 6,504,227 | B1 * | 1/2003 | Matsuo et al. | 257/531 |
| 6,593,841 | B1 | 7/2003 | Mizoguchi et al. | |
| 7,646,610 | B2 | 1/2010 | Watanabe | |
| 2001/0017582 | A1 | 8/2001 | Sakata | |

(Continued)

OTHER PUBLICATIONS

Gardner et al., "Review of On-Chip Inductor Structures With Magnetic Films", IEEE Transactions on Magnetics, vol. 45, No. 10, Oct. 2009, pp. 4760-4766.

(Continued)

*Primary Examiner* — Alonzo Chambliss

(57) ABSTRACT

Magnetic microinductors formed on semiconductor packages are provided. The magnetic microinductors are formed as one or more layers of coplanar magnetic material on a package substrate. Conducting vias extend perpendicularly through the plane of the magnetic film. The magnetic film is a layer of isotropic magnetic material or a plurality of layers of anisotropic magnetic material having differing hard axes of magnetization.

35 Claims, 10 Drawing Sheets

(56) References Cited

U.S. PATENT DOCUMENTS

| | | | | |
|---|---|---|---|---|
| 2002/0084509 | A1* | 7/2002 | Ballantine et al. | 257/531 |
| 2003/0107440 | A1 | 6/2003 | Miki et al. | |
| 2004/0046631 | A1 | 3/2004 | Sakakura et al. | |
| 2006/0279267 | A1 | 12/2006 | Burton et al. | |
| 2008/0136574 | A1 | 6/2008 | Jow et al. | |
| 2008/0290980 | A1 | 11/2008 | Gardner et al. | |
| 2008/0309442 | A1 | 12/2008 | Hebert | |
| 2009/0015363 | A1 | 1/2009 | Gardner et al. | |
| 2009/0117325 | A1 | 5/2009 | Gardner et al. | |
| 2009/0166804 | A1 | 7/2009 | Gardner et al. | |
| 2009/0169874 | A1 | 7/2009 | McCloskey et al. | |
| 2009/0207576 | A1 | 8/2009 | Gardner et al. | |
| 2010/0001826 | A1* | 1/2010 | Gardner et al. | 336/232 |
| 2010/0118501 | A1 | 5/2010 | Hazucha et al. | |

OTHER PUBLICATIONS

Gardner et al., "Integrated on-chip inductors using magnetic material (invited)," Journal of Applied Physics 103, 07E927, American Institute of Physics, Apr. 2008, 6 pages.

Office Action received for U.S. Appl. No. 12/217,293, mailed on Apr. 14, 2010, 14 pages.

Office Action Response for U.S. Appl. No. 12/217,293, filed Jun. 17, 2010, 6 pages.

Notice of Allowance Received for U.S. Appl. No. 12/217,293, Mailed on Nov. 22, 2010, 6 pages.

* cited by examiner

MAGNETIC MICROINDUCTORS FOR INTEGRATED CIRCUIT PACKAGING

CROSS REFERENCE TO RELATED APPLICATIONS

The present application is a continuation-in-part of U.S. patent application Ser. No. 12/217,293, entitled "Inductors for Integrated Circuit Packages," filed Jul. 2, 2008, now pending, the disclosure of which is incorporated herein by reference.

BACKGROUND OF THE INVENTION

1. Field of the Invention

The embodiments of the invention relate generally to integrated circuits, packages for integrated circuits, magnetic inductors, and magnetic inductors for integrated circuit packages.

2. Background Information

In general, magnetic inductors are components of electrical circuits that are able to store energy in a magnetic field. Magnetic fields are created, for example, by electric current passing through one or more wires. Inductor structures can form parts of electronic circuits for, for example, voltage converters, electromagnetic interference (EMI) noise reduction, and other applications such as RF circuits.

Integrated circuits (ICs) formed on semiconductor substrates such as silicon wafers (also known as integrated circuit chips, microchips, chips, or dies) form the basis for almost all electronic devices. After manufacture, the IC chip is typically packaged in a manner that takes into account the operating environment provided by the device in which it will reside. A chip may be packaged, for example, in an individual package, incorporated into a hybrid circuit (in multichip modules (MCMs)), or mounted directly on a board, a printed circuit board, or a chip-on-board (COB). In general, the package for the IC chip protects the chip from damage and supplies electronic connections that connect the IC chip to power supplies and other electronic components (performing, for example, input/output functions) that make up the device in which the IC chip resides.

DETAILED DESCRIPTION OF THE INVENTION

Figure 1A:
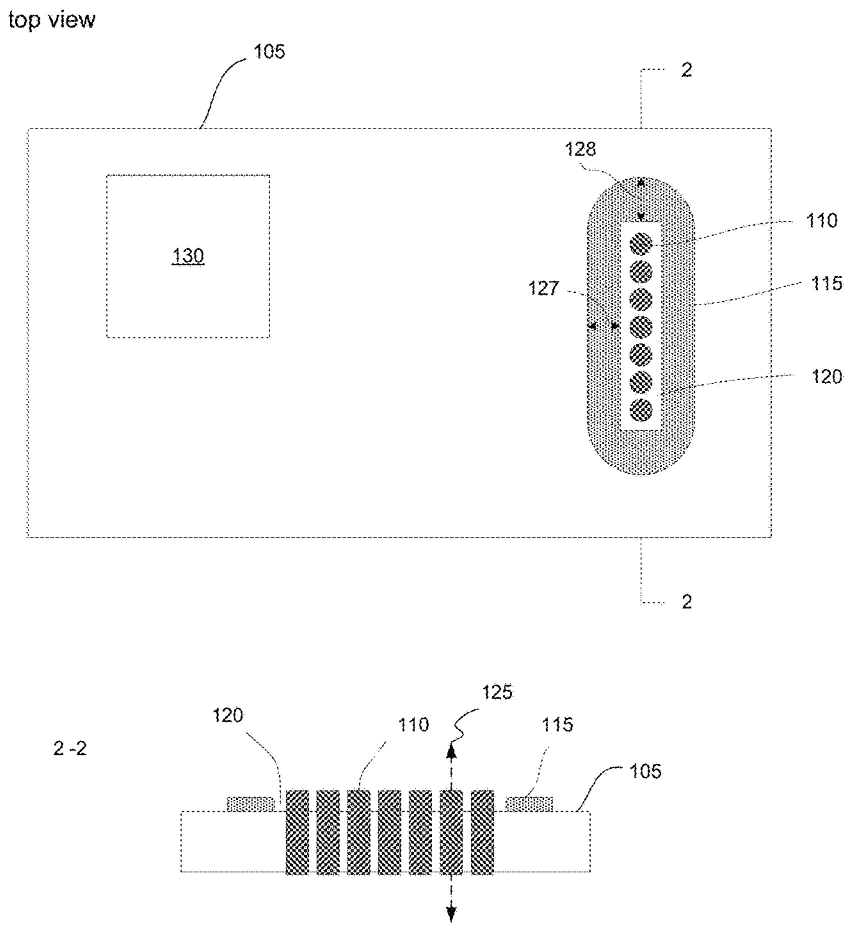
FIGS. 1A and B provide inductor structures on a package substrate.

Packaging of an integrated circuit (IC) chip can involve attaching the IC chip to a substrate (a packaging substrate) which, among other things, provides mechanical support and electrical connections between the chip and other electronic components of a device. Substrate types include, for example, cored substrates, including thin core, thick core (laminate BT (bismaleimide-triazine resin) or FR-4 type fibrous board material), and laminate core, as well as coreless substrates. Cored package substrates, for example, can be built up layer by layer around a central core, with layers of conductive material (usually copper) separated by layers of insulating dielectric, with interlayer connections being formed with through holes or microvias (vias).

In general, a via is an opening created in a package substrate in which the opening is filled with a material that is different from that of the package substrate. Some vias are holes through the substrate that are filled with conducting material. These conducting vias can be used, for example, to connect electronic circuitry placed on one face of the substrate core with electronic circuitry and or power supplies placed on the opposite face of the substrate core. Typically the core substrate is an insulating material, such as for example, an epoxy resin embedded with glass cloth reinforcement. Other materials that are currently used as a core substrate include, for example, glass fiber reinforced resin. Conducting materials include metals such as copper, gold, tungsten, and aluminum and their alloys. Advantageously, embodiments of the present invention are not limited to a particular type of package substrate or conducting material that is used to fill a via hole. Currently, copper and aluminum are the conducting materials that are most often chosen for forming conducting lines in the semiconductor industry. Vias can also be, for example, plated-through holes (PTH).

A magnetic via is a region in which two magnetic layers contact each other to complete a circuit for the magnetic flux. The optimal structure for a magnetic via can differ from that of an electrically conductive via in part because the magnetic via is used to route the magnetic flux and it does not need to be electrically conductive.

In general, single layer isotropic magnetic materials or layers of magnetic materials having orthogonal axes of magnetization can eliminate the need for magnetic vias. Single layer isotropic magnetic materials or layers of magnetic materials formed as slots can be used for inductors on package substrates and can also provide the ability to control eddy currents within magnetic materials. Inductors formed from magnetic materials on the package are useful, for example, for voltage converters, electromagnetic noise (EMI) noise reduction, as well as, in radio frequency (RF) circuits (e.g., in power amplifiers), and in system-on-a-chip applications (SOCs). Integrated DC-DC converters operating at high power levels of 100 watts or more can be used, for example, to supply power to a processor, graphics chip, chipsets, or other circuits. An additional advantage of using inductors on a package is that the circuit for converting the voltage from a power source to the chip can be located near to the processor or other chip-based device such as for example graphics chips and chipsets. Placing the chip-based device near the circuit for converting voltage can significantly reduce the electronic noise and power losses associated with voltage converting circuits that are located further from the chip.

Referring to FIG. 1A, a non-linear magnetic film that has isotropic magnetic properties forms an inductor structure on a via-containing package substrate. In FIG. 1A, a package substrate 105 contains a plurality of conducting vias 110. A non-linear isotropic magnetic layer 115 is deposited on the substrate surface, is coplanar with the substrate surface, and surrounds the conducting vias 110. Although FIG. 1A is shown having seven conducting vias 110, other numbers of conducting vias are possible, such as for example, a number of conducting vias 110 that is between (and includes) 1 and 20, is between (and includes) 3 and 10, or is between (and includes) 4 and 7. The vias do not have to be circular wires (circular in shape when viewed as a slice of the wire or as viewed in the perspective of the "top view" of FIG. 1A) and other shapes having flattened sides are also possible, such as squares or rectangles, or shapes having five or more sides, for example. A space 120 is provided between conducting vias 110 and isotropic magnetic layer 115 so that conducting vias 110 and magnetic layer 115 do not make physical contact. The space 120 is typically filled with an insulating material which is also typically the same insulating material that is used to cover and protect the inductor structure (e.g., to isolate the inductor from the atmosphere) after the inductor structure is formed. Optionally, in the embodiment having only one conducting via 110, no space 120 between the conducting via 110 and the isotropic magnetic layer is provided. In additional embodiments, the inductor structure on the package substrate is one of a plurality of inductor structures according to FIG. 1A. Further optionally, the rounded sides of the magnetic film 115 extend further from the edges of the conducting vias 110 than the straight sides of the magnetic film 115. For some embodiments in which the rounded sides extend further than the straight sides of the magnetic film 115, the ratio of the width 127 of the film 115 on the straight side to the width 128 of the film 115 on the rounded side is in the range of 1:1.5 to 1:5. Other ratios are possible and the selection of a ratio of widths for an application may depend on factors such as, for example, the amount of current the conducting vias will be handling and the number of conducting vias to be included in the inductor structure. Typically, the isotropic magnetic layer has a thickness in the range of 0.20 μm to 50 μm. A cut-through view along line 2-2 is provided and labeled "2-2" in FIG. 1A. Arrows 125 show the axis along which current flows in the vias 110. Optionally, the rounded sides shown for the magnetic layer 115 may not form a continuous arc, but may instead be approximated by a plurality of straight edges.

Figure 1B:
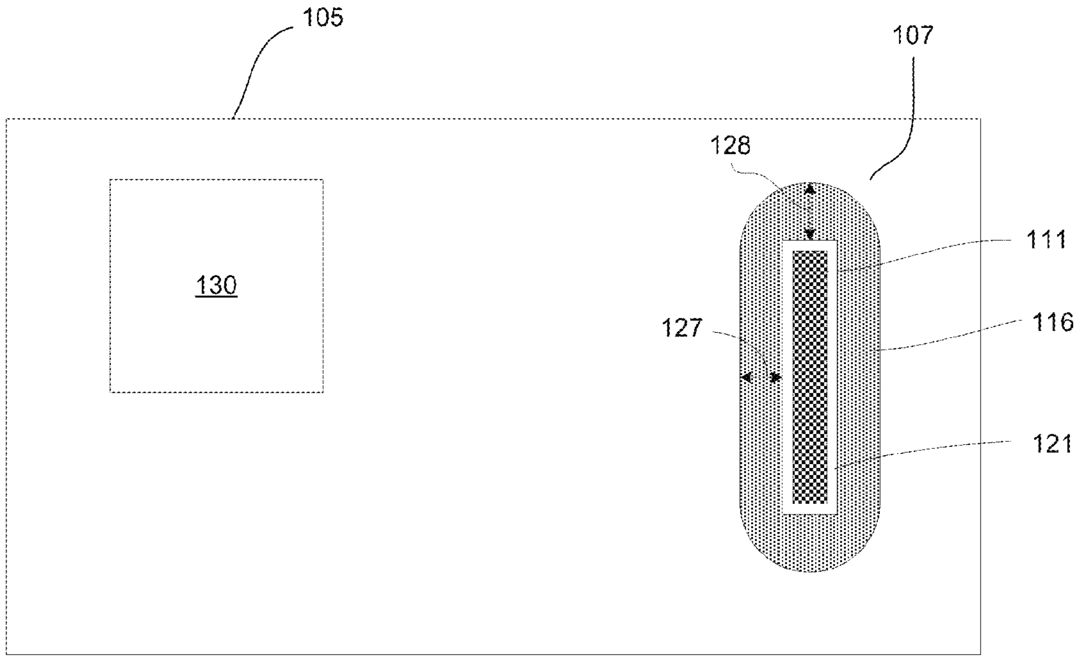

For inductor structures having one conducting via extending perpendicularly through a non-linear magnetic film, the conducting via is optionally elongated along one dimension, so that it forms a rectangular shape (rectangular in shape when viewed as a slice of the wire or as viewed in the perspective of the "top view" of FIG. 1B) or a rectangular shape having rounded ends (similar to an oval shape). In FIG. 1B, an inductor structure 107 is formed on package substrate 105. In FIG. 1B, the elongated rectangular via 111 replaces the linear arrangement of two or more vias of FIG. 1A. Optionally, a gap 121 exists between the magnetic film 116 and the conducting via 111. The gap 121 is filled, for example, with non-conducting material, such as silicon dioxide. In additional embodiments, there is no gap 121. Further optionally, the rounded sides of the magnetic film 116 extend further from the edges of the conducting via 111 than the straight sides of the magnetic film 116. For some embodiments in which the rounded sides extend further than the straight sides of the magnetic film 115, the ratio of the width 127 of the film 116 on the straight side to the width 128 of the film 116 on the rounded side is in the range of 1:1.5 to 1:5. Other ratios are possible and the selection of a ratio of widths for an application may depend on factors such as, for example, the amount of current the conducting vias will be handling and the number of conducting vias to be included in the inductor structure.

The conducting vias 110 and 111 are comprised, at least in part, of a conducting material, such as, for example, a metal. The most common metals used in the semiconductor industry currently are copper (Cu) and aluminum (Al), although other metals or conducting materials are possible, such as for example, Au, Ag, Pt, Pd, Ni, and alloys thereof (including alloys of Cu and Al). Using non-linear magnetic materials that are magnetically isotropic or less anisotropic can result in inductor devices that provide high inductance density and low hysteretic losses. Advantageously, using only one layer of magnetic material simplifies the patterning and manufacture process for packages having magnetic microinductor components. Additionally, using a single layer of magnetic material can potentially replace the use of magnetic vias, the use of which can exacerbate unwanted eddy currents.

Other inductor structures that employ non-linear magnetic materials are possible. For example the non-linear magnetic film is associated with a spiral conducting wire to form an inductor. The spiral is formed on the surface of the substrate and one or more magnetic films are placed on the substrate above and or below the spiral structure and cover part or all of the spiral structure. In some embodiments, the magnetic film is coextensive with or extends beyond the boundaries of the spiral structure in some or all regions of the boundary of the spiral structure. The magnetic film(s) are separated from the conducting wires by one or more insulating layers. In additional embodiments, the conducting wire is formed on the surface of the substrate and one or more magnetic films are placed on the substrate above and or below the conducting wire. In some embodiments, the magnetic film is coextensive with or extends beyond the boundaries of the conducting wire. The non-linear magnetic film is formed as a continuous structure or a slotted structure. The slots form lines (or stripes) in which no magnetic material is present.

As shown in FIGS. 1A and B, typically a package substrate 105 houses at least one chip 130 and electronic connections to, for example, other components of an electronic device (not shown) in which the package substrate 105 is housed, and to one or more voltage regulators (not shown) for supplying power to the chip. In an embodiment of the invention, the conducting vias 110 (or 111 are) electrically connected to a voltage regulator (not shown) and also to the chip 130 housed on package substrate 105. The voltage regulator is located either on the opposite side or on the same side of the package substrate 105 as the chip 130. In embodiments of the invention, the switching frequency for the voltage converter is between 10 MHz and 500 MHz so that the inductors and capacitors can be made smaller thereby allowing for their integration onto the package (or even the silicon substrate).

In general, non-linear magnetic material films are formed, for example, by depositing the magnetic layer in the presence of a rotating magnetic field, a switching magnetic field, or no magnetic field. In some embodiments, a rotating or switching magnetic field is used during deposition to cancel out unwanted ambient magnetic fields that may be present during the deposition. The non-linear magnetic film has isotropic magnetic properties or attenuated anisotropic properties. The magnetic material can be, for example, CoZrTa, CoZrNb, CoZrTaN, CoFeHfO, CoPRe, CoPFeRe, NiFe, FeCo, CoZr, CoZrFe, CoZrTaB, CoZrB and or mixtures thereof. A magnetic film is comprised, for example, of CoZrTa: 91.5% Co, 4.0% Zr, and 4.5% Ta (atomic %); NiFe: 80% Ni and 20% Fe (atomic %); CoZrB: 86.5% Co, 9.5% Zr, and 4.0% B (atomic %); and CoZrFe: 88% Co, 5.5% Zr, and 6.5% Fe (atomic %). Typically a magnetic film comprised of CoZrTa contains from 3 to 13% Zr and from 2 to 12% Ta. These magnetic materials are deposited, for example, using electroplating or sputter deposition techniques commonly employed in the semiconductor processing industry, such as, for example DC magnetron sputter deposition. Optionally, a layer of tantalum (Ta) or titanium (Ti) is deposited on the package substrate before the magnetic layer is deposited. The layer of Ta or Ti aids in the adhesion of the magnetic layer to the package substrate surface. Advantageously, the non-isotropic magnetic films can be deposited as one layer, although films comprised of a plurality of layers can also be used.

Figure 2:
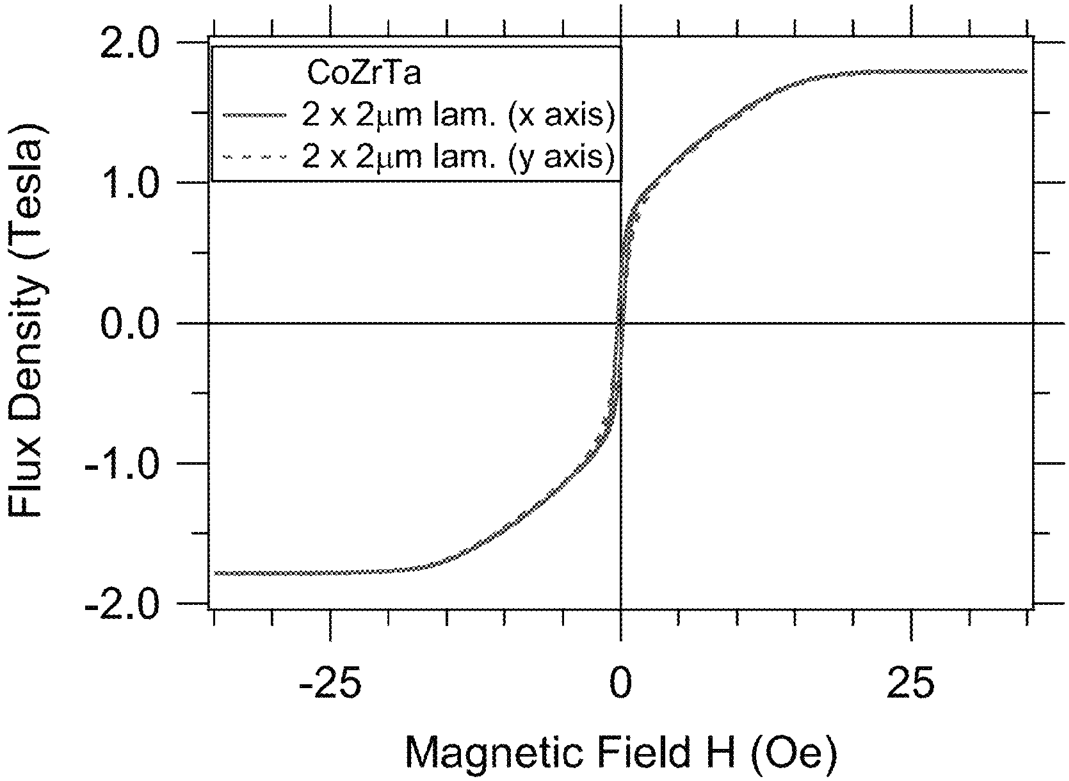
FIG. 2 shows the results of the measurement of a magnetic hysteresis loop for a non-linear isotropic magnetic film.

FIG. 2 graphs the results of the measurement of the magnetic hysteresis loop for an exemplary isotropic 4 μm thick CoZrTa film (91.5% Co, 4.0% Zr, and 4.5% Ta (atomic %)) on an insulating substrate. As can be seen in FIG. 2, in this example, the nonlinear material is magnetically isotropic and thereby provides large increases in inductance with minimal hysteretic losses. The minimization of hysteretic losses observed results from the small coercivity of the isotropic magnetic film. In general, the coercivity of a material is the applied magnetic field required to reduce the magnetization of the material to zero after the magnetization of the sample has been driven to saturation. The slope of the curve in FIG. 2 corresponds to the permeability and is non-linear. The film shown in FIG. 2 was deposited as two layers which were each 2 μm thick. Magnetic layers were deposited using DC magnetron sputter deposition. In this example, the substrate was comprised of Si that was coated with a $SiO_2$ film and there was a 15 nm thick Ti underlayer beneath the magnetic material.

Figure 3A:
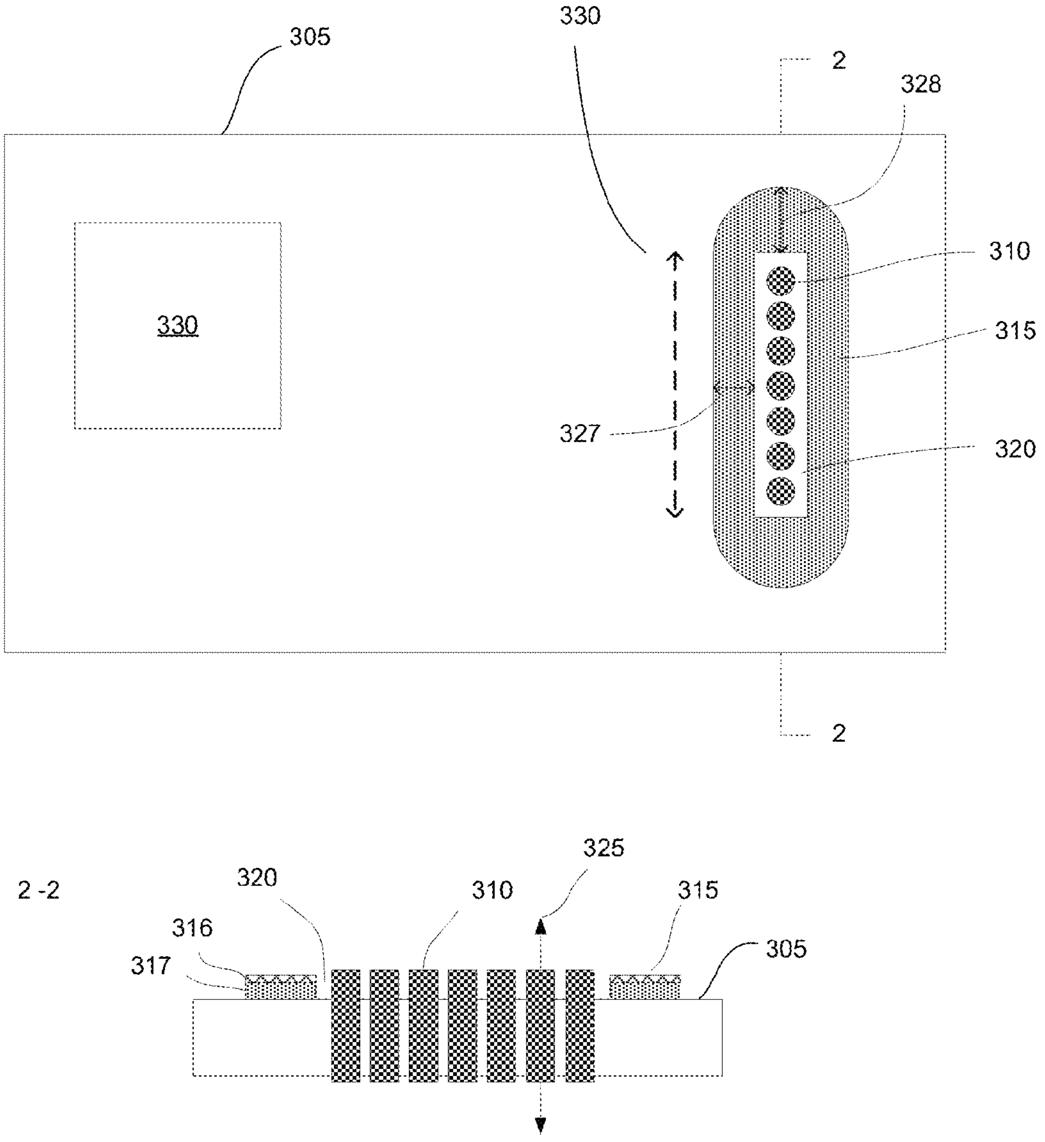
FIGS. 3A and 3B provide a drawing of an inductor structure on a package substrate and a view of the magnetic layer, respectively.

FIG. 3A shows an inductor device that is comprised of a multi-layered magnetic film. In FIG. 3A, a package substrate 305 has a plurality of conducting microvias 310. Layers of non-isotropic magnetic material 315 are disposed on the substrate surface, are coplanar with the substrate surface, and surround the conducting vias 310. In this embodiment, magnetic film 315 is comprised of two layers of magnetic material 316 and 317. In additional embodiments, the magnetic film is comprised of a plurality of layers of magnetic material 316 and 317 separated by insulating layers. Although there are seven conducting vias 310 shown in FIG. 3A, other numbers of conducting vias 310 are possible, such as for example, a number of conducting vias 310 that is between (and includes) 1 and 20, between (and includes) 3 and 10, or between (and includes) 4 and 7. The vias do not have to be circular (as viewed from the first view in FIG. 3A) wires and other shapes having flattened sides are also possible, such as squares or rectangles, or five or more sided figures, for example. The conducting vias 310 could be a single rectangular shaped via having an elongated dimension parallel to the longest dimension of the magnetic film 315. A space 320 is provided between conducting vias 310 and isotropic magnetic layer 315 so that conducting vias 310 and magnetic layer 315 do not make physical contact. The space 320 is typically filled with an insulating material (not shown) which is also typically the same insulating material that is used to cover (and protect) the inductor structure after the inductor structure is formed. In the embodiment in which only one conducting via 310 is present, the space 320 optionally is not present. The rounded sides of the magnetic film 315 optionally extend further from the edges of the conducting vias 310 than the straight sides of the magnetic film 315. For some embodiments in which the rounded sides extend further than the straight sides of the magnetic film 315, the ratio of the width 327 of the film 315 on the straight side to the width 328 of the film 315 on the rounded side is in the range of 1:1.5 to 1:5. Other ratios are possible and the selection of a ratio of widths for an application may depend on factors such as, for example, the amount of current the conducting vias will be handling and the number of conducting vias to be included in the inductor structure and the ratio of the thicknesses of the magnetic layers d1 and d2 in FIG. 3B. Optionally, the rounded sides shown for the magnetic layer 315 may not form a continuous arc, but may instead be approximated by a plurality of straight edges. Optionally also, magnetic layer 315 is not a solid shape, but instead has slots (not shown) in which there is no magnetic material. The slots form lines (or stripes) in which no magnetic material is present that are orthogonal to the direction of eddy current flow. In embodiments of the invention, the plurality of magnetic layers (and or magnetic layers plus intervening insulating layers) have a combined thickness in the range of 0.20 μm to 50 μm. The hard axis of magnetization for isotropic magnetic film 317 is indicated by arrow 330.

For inductor structures having one conducting via extending perpendicularly through the multi-layered non-isotropic magnetic film, the conducting via is optionally elongated along one dimension, so that it forms a rectangular shape (rectangular in shape when viewed as a slice of the wire or as viewed in the perspective of the "top view" of FIG. 1B) or a rectangular shape having rounded ends (similar to an oval shape). The inductor structure is similar to the structure shown and described for FIG. 1B except that the magnetic film is a multilayer non-isotropic film. The elongated rectangular via replaces the linear arrangement of two or more vias. The hard axis of magnetization for one layer of non-isotropic magnetic material parallels the direction of elongation for the conducting via.

The conducting via(s) 310 are comprised, at least in part, of a conducting material, such as, for example, a metal. The most common metal used in the semiconductor industry currently is copper (Cu) or aluminum (Al), although other metals or conducting materials are possible, such as for example, Au, Ag, Pt, Pd, Ni, and alloys thereof (including alloys of Cu and Al). Arrows 325 show the axis along which current flows in the via(s) 310. A cut-through view along line 2-2 is provided and labeled "2-2" in FIG. 3.

Figure 3B:
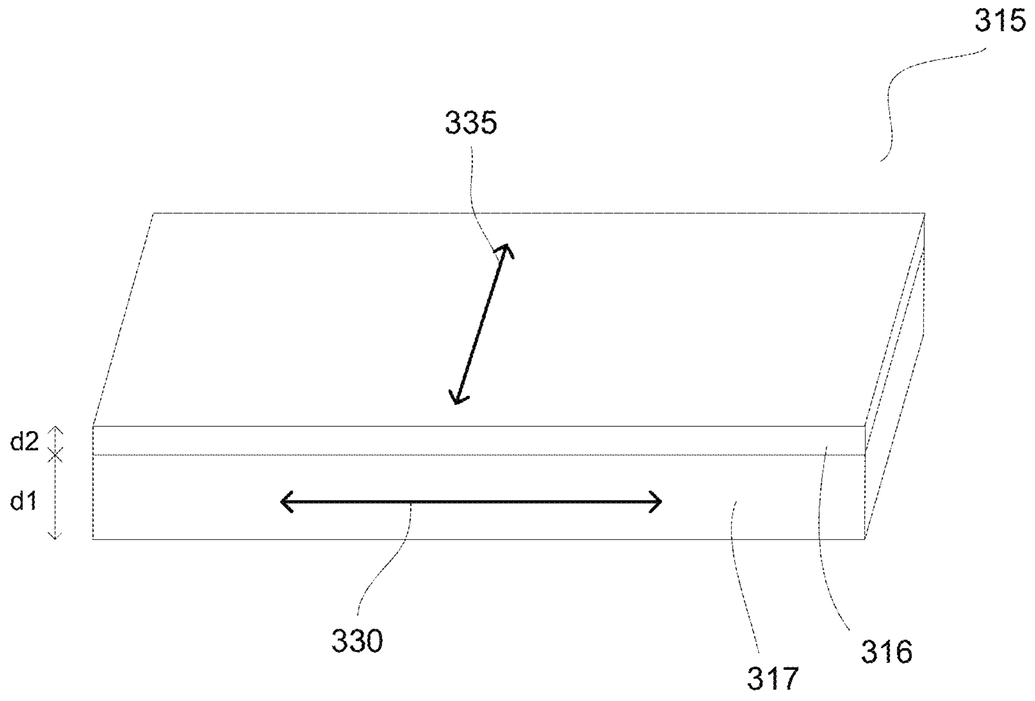

FIG. 3B provides a closer look at the magnetic layer 315 of FIG. 3A. In FIG. 3B, magnetic layer 317 has a thickness of d1 and a hard axis of magnetization along axis 330. The hard axis of magnetization 330 parallels the axis along which the conducting vias 310 are arranged. In other words, if a line is drawn through the centers of the conducting vias 310 in FIG. 3A, the hard axis of magnetization of magnetic layer 317 is parallel to that line. The hard axis of magnetization 335 of the second magnetic film 316 is transverse to the hard axis of magnetization 330 of the first magnetic film 317. In an embodiment, the ratio of d1 to d2 is 4:1, so that for a magnetic layer 315 that is 5 μm thick, the thickness of magnetic layer 317 is 4 μm and the thickness of magnetic layer 316 is 1 μm. The ratio can also be a value that is between and includes 1:1 and 6:1, 2:1 to 6:1, and 3:1 to 5:1. The ratio selected is dependent, in part, on the size of the device that is employed (e.g., how many conducting vias extend perpendicularly through the film) and the relative proportions of the magnetic film, e.g., the width 327 of the magnetic film 315 on the straight side and the width 328 of the magnetic film 315 on the rounded side. In additional embodiments more than two layers of magnetic material are used. An exemplary magnetic inductor having three magnetic layers has, for example, one layer that has an axis of magnetization that is orthogonal to the axes of magnetization of the other two layers or the three layers have three axes of magnetization are 120 degrees apart. For structures having more than one layer of non-isotropic magnetic material, the hard axes of magnetization of some or all the layers are different.

Typically, an insulating film is placed between the layers of magnetic material 317 and 316 (and any additional layers of magnetic material) of FIG. 3B. In embodiments in which the magnetic film comprises Co, an insulating layer is, for example cobalt oxide, aluminum nitride, or aluminum oxide, although other insulating materials optionally are used. In one embodiment, an insulating layer of cobalt oxide layer has a thickness of between 2.0 nm and 50 nm and is a mixture of oxides of cobalt oxide, including CoO, $Co_3O_4$, and $Co_2O_3$. Additionally, optionally, an adhesion layer that aids in adhesion of the magnetic layer to the package substrate is placed on the package substrate surface before the first magnetic layer is deposited (in this example, the first film is magnetic layer 317). The adhesion layer can be, for example, a layer of tantalum (Ta) or titanium (Ti), having a thickness of between 5 nm to 25 nm.

In general, multilayer films comprised of magnetic materials in which the films exhibit different hard axes of magnetization are formed, for example, by depositing the magnetic layer in the presence of a magnetic field. The magnetic material can be, for example, CoZrTa, CoZrNb, CoZrTaN, CoFeHfO, CoPRe, CoPFeRe, NiFe, FeCo, CoZr, CoZrFe, CoZrTaB, CoZrB, and or mixtures thereof. A magnetic film is comprised, for example, of CoZrTa: 91.5% Co, 4.0% Zr, and 4.5% Ta (atomic %); NiFe: 80% Ni and 20% Fe (atomic %); CoZrB: 86.5% Co, 9.5% Zr, and 4.0% B (atomic %); and CoZrFe: 88% Co, 5.5% Zr, and 6.5% Fe (atomic %). Typically a magnetic film comprised of CoZrTa contains from 3 to 13% Zr and from 2 to 12% Ta. These magnetic materials are deposited, for example, using electroplating or sputter deposition techniques commonly employed in the semiconductor processing industry, such as, for example DC magnetron sputter deposition. For example, an alloy of Co and phosphorous, comprising 90% Co is electroplated. Optionally, a layer of tantalum or titanium is deposited on the package substrate before the magnetic layer is deposited. The layer of tantalum or titanium aids in the adhesion of the magnetic layer to the package substrate surface and can also act as a seed layer for electroplating.

In additional embodiments, the magnetic film 315 of FIG. 3 is a multilayer magnetic film that is comprised of three or more magnetic layers having different thicknesses and differently oriented hard axes of magnetization. Typically, one layer is a thicker film that is formed with its hard axis of magnetization aligned with the elongated direction of the inductor structure. The second magnetic layer typically has a hard axis of magnetization orthogonal to (transverse to) the first layer so as to act as a magnetic connection at the ends of the elongated inductor structure, although other configurations are possible in which the hard axes are oriented along different axes. In one embodiment, the hard axes of magnetization of nearest neighbor layers are orthogonal to each other. This second layer typically is thinner so as to minimize the impact from the additional eddy currents that flow in this layer, but thick enough to provide a path for the magnetic flux. Third, fourth and fifth magnetic layers that are separated by a dielectric layer are added, for example, to form the inductor structure. Exemplary laminated dielectric layers include a cobalt oxide layer, an aluminum nitride layer, or an aluminum oxide layer. Optionally, the rounded sides of the magnetic film 315 extend further from the edges of the conducting vias 310 than the straight sides of the magnetic film 315. The wider width at the ends of the structure can aid in preventing magnetic saturation. Optionally, an adhesive layer is provided between the substrate and the magnetic film.

In FIG. 3A, typically a package substrate 305 houses at least one chip 330 and electronic connections to, for example, other components of an electronic device (not shown) in which the package substrate 305 is housed and to a voltage regulator (not shown). In an embodiment of the invention, the conducting via(s) 310 are electrically connected to a voltage regulator (not shown) and also to the chip 130. The voltage regulator is located either on the opposite side or on the same side of the package substrate 305 as the chip 330. In embodiments of the invention, the switching frequency for the voltage converter is between 10 MHz and 500 MHz so that the inductors and capacitors can be made smaller thereby allowing for their integration onto the package (or even the silicon substrate).

Figure 4:
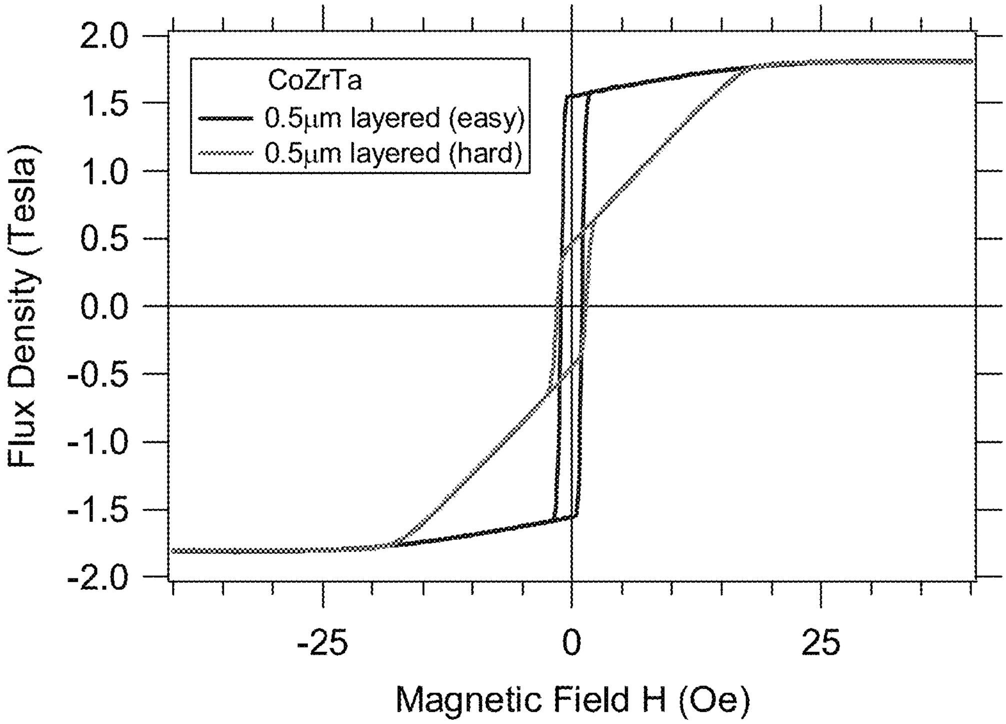
FIG. 4 shows the results of the measurement of a magnetic hysteresis loop for a bilayer anisotropic magnetic film.

FIG. 4 graphs the measurement of the B-H magnetic hysteresis loop for a bilayer anisotropic magnetic material on an insulating substrate. In this example, the magnetic material was a CoZrTa film having two layers of magnetic material, one of which was 0.4 μm thick, and the other of which was 0.1 μm thick. The hard axes of magnetization of the two layers of magnetic material were transverse to one another. An insulating layer that was a 7 nm thick cobalt oxide layer separated the two magnetic layers. The bi-layered magnetic material demonstrated good properties along the hard axis of magnetization (the curve labeled "hard" in the graph) and adequate properties along the easy axis. The thinner 0.1 μm film layer supports the magnetic material film on the ends of the inductor structures and exhibited a gradual slope along the easy axis (the curve labeled "easy" in the graph). Magnetic layers were deposited using DC magnetron sputter deposition process and the thin cobalt oxide layer was formed by exposure to an oxidizing ambient. The substrate in this example was silicon and a Ta adhesive layer separated the magnetic film from the substrate.

Figure 5A:
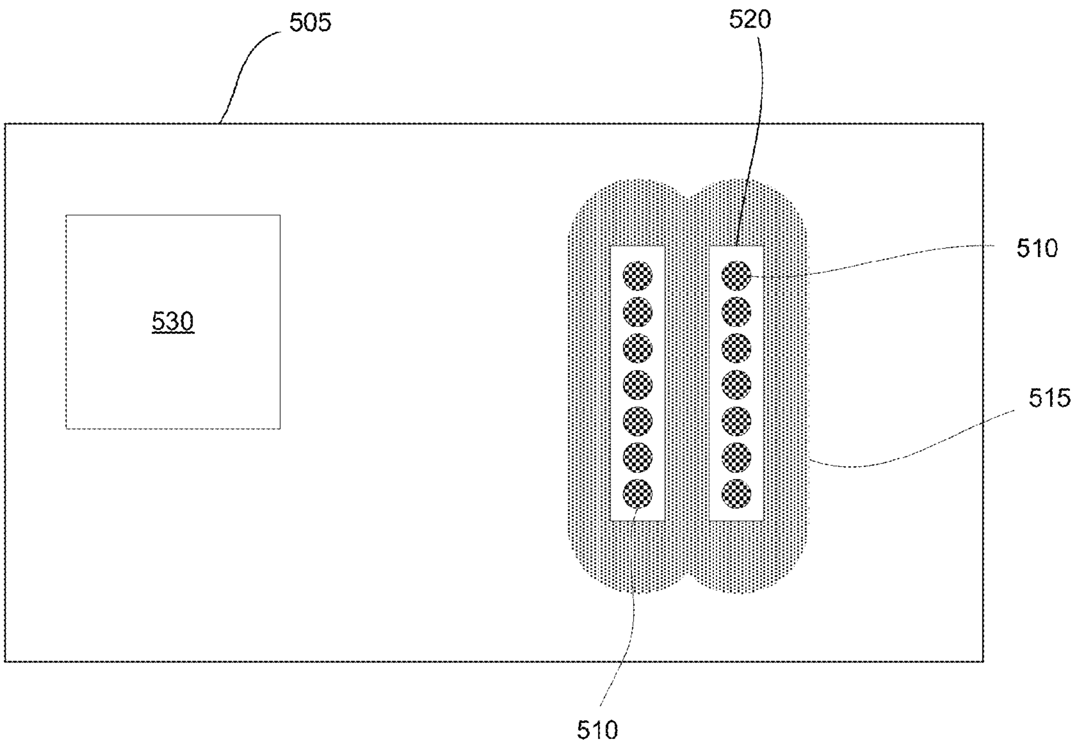
FIGS. 5A-D provide additional inductor structures that can be housed on a package substrate.

FIGS. 5A-D provide additional embodiments of inductors which include magnetic films on package substrates. In FIG. 5A, the package substrate 505 houses a plurality of conducting vias 510. A magnetic film 515 is housed on and is coplanar with the package substrate 505 surface. Although there are fourteen conducting vias 510 shown in FIG. 5A, other numbers of conducting vias 510 are possible, such as for example, a number of conducting vias 510 that is between (and includes) 2 and 32, between (and includes) 6 and 20, or between (and includes) 8 and 16. The vias 510 do not have to be circular (as viewed from the top view in the slice of FIG. 5A) wires and other shapes having flattened sides are also possible, such as squares or rectangles, or five or more sided figures, for example. Space 520 is provided between conducting vias 510 and magnetic layer 515 so that conducting vias 510 and magnetic layer 515 do not make physical contact. The space 520 is typically filled with an insulating material (not shown) which is also typically the same insulating material that is used to cover (and protect) the inductor structure after the inductor structure is formed. Optionally, in one embodiment, the rounded sides of the magnetic film 515 have larger widths than the straight sides of the magnetic film 515.

Figure 5B:
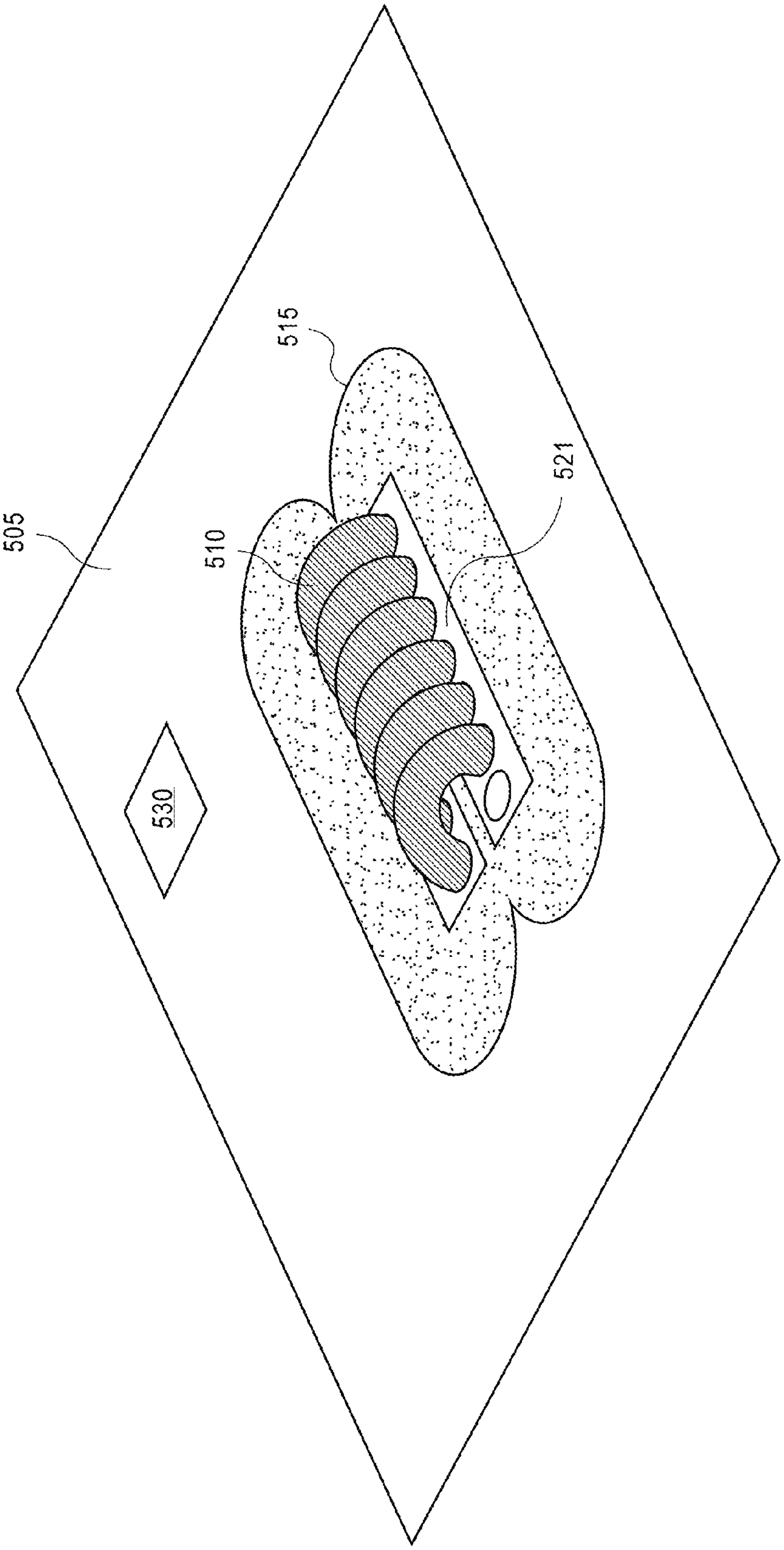

FIG. 5B provides a different view of the device of FIG. 5A. In FIG. 5B, a coil-like conducting wire structure spanning both sides of the package substrate 505 (only one side of the package substrate 505 is shown) connects the vias 510, so that the vias 510 are electrically connected. In this embodiment, the via-coil structure is surrounded by the magnetic film 515 so that all of the conducting vias 510 extend through the magnetic film 515. A first end-located conducting via 510 is electrically connected, for example, to a voltage converter (not shown) and a second end-located conducting via is electrically connected, for example, to a chip 530. The voltage converter (not shown) is located on the opposite side or on the same side of the package substrate 505 as the chip 530 and the conducting vias electrically connect (connections not shown) the voltage regulator (not shown) to the chip 530. The magnetic films 515 of FIG. 5A-B are a single layer of non-linear magnetic material (e.g., similar to that of the inductor of FIG. 1), or are multilayer magnetic films having orthogonal hard axes of magnetization (e.g., the inductor of FIGS. 3A and B).

Figure 5C:
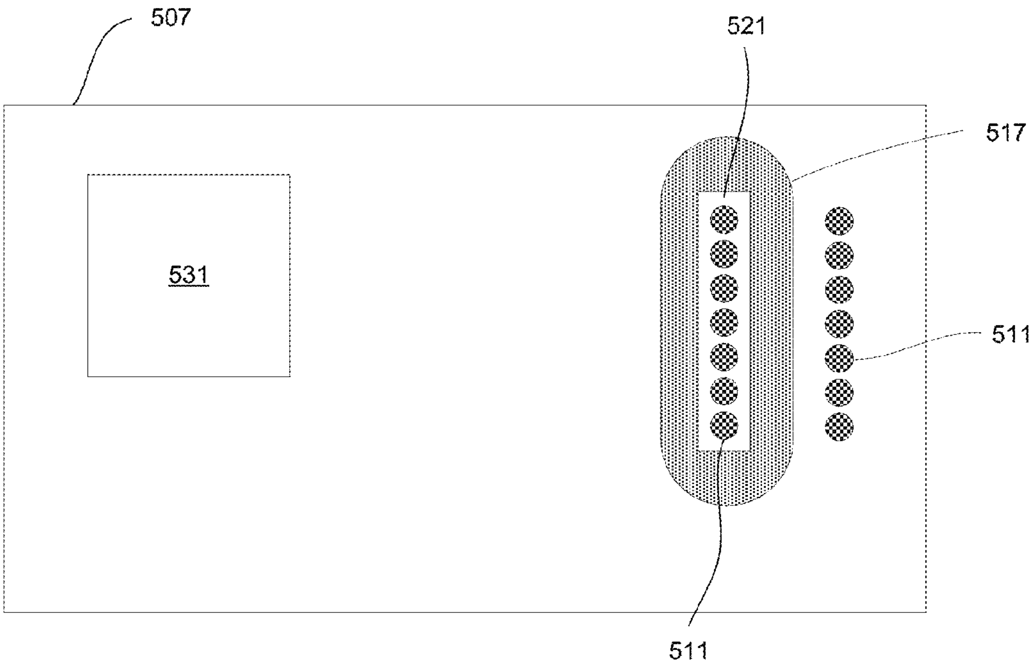

In FIG. 5C the package substrate 507 houses a plurality of conducting vias 511. Half of the conducting vias 511 extend perpendicularly through a magnetic film 517 (and the package substrate 507) and the other half extend perpendicularly through the package substrate 507 but not through magnetic film 517. The magnetic film 517 is housed on and coplanar with the package substrate 507 surface. Although there are fourteen conducting vias 511 shown in FIG. 5C, other numbers of conducting vias 511 are possible, such as for example, a number of conducting vias 511 that is between (and includes) 2 and 32, between (and includes) 6 and 20, or between (and includes) 8 and 16. The vias 511 do not have to be circular (as viewed from the top view of the slice in FIG. 5D) wires and other shapes having flattened sides are also possible, such as squares or rectangles, or five or more sided figures, for example. Space 521 is provided between conducting vias 511 and magnetic layer 517 so that conducting vias 511 and magnetic layer 517 do not make physical contact. The space 521 is typically filled with an insulating material (not shown) which is also typically the same insulating material that is used to cover (and protect) the inductor structure after the inductor structure is formed. Optionally, the rounded sides of the magnetic film 517 extend further from the edges of the conducting vias 511 than the straight sides of the magnetic film 517. In some embodiments, the ratio of the width of the straight side of the magnetic layer 517 and the width of the rounded side of magnetic film 517 is in the range of 1:1.5 to 1:5. Other width ratios are possible and the selection of a ratio for an application may depend on factors such as, for example, the amount of current the conducting vias will be handling and the number of conducting vias to be included in the inductor structure. Optionally, the rounded sides shown for the magnetic layer 517 may not form a continuous arc, but may instead be approximated by a plurality of straight edges.

Figure 5D:
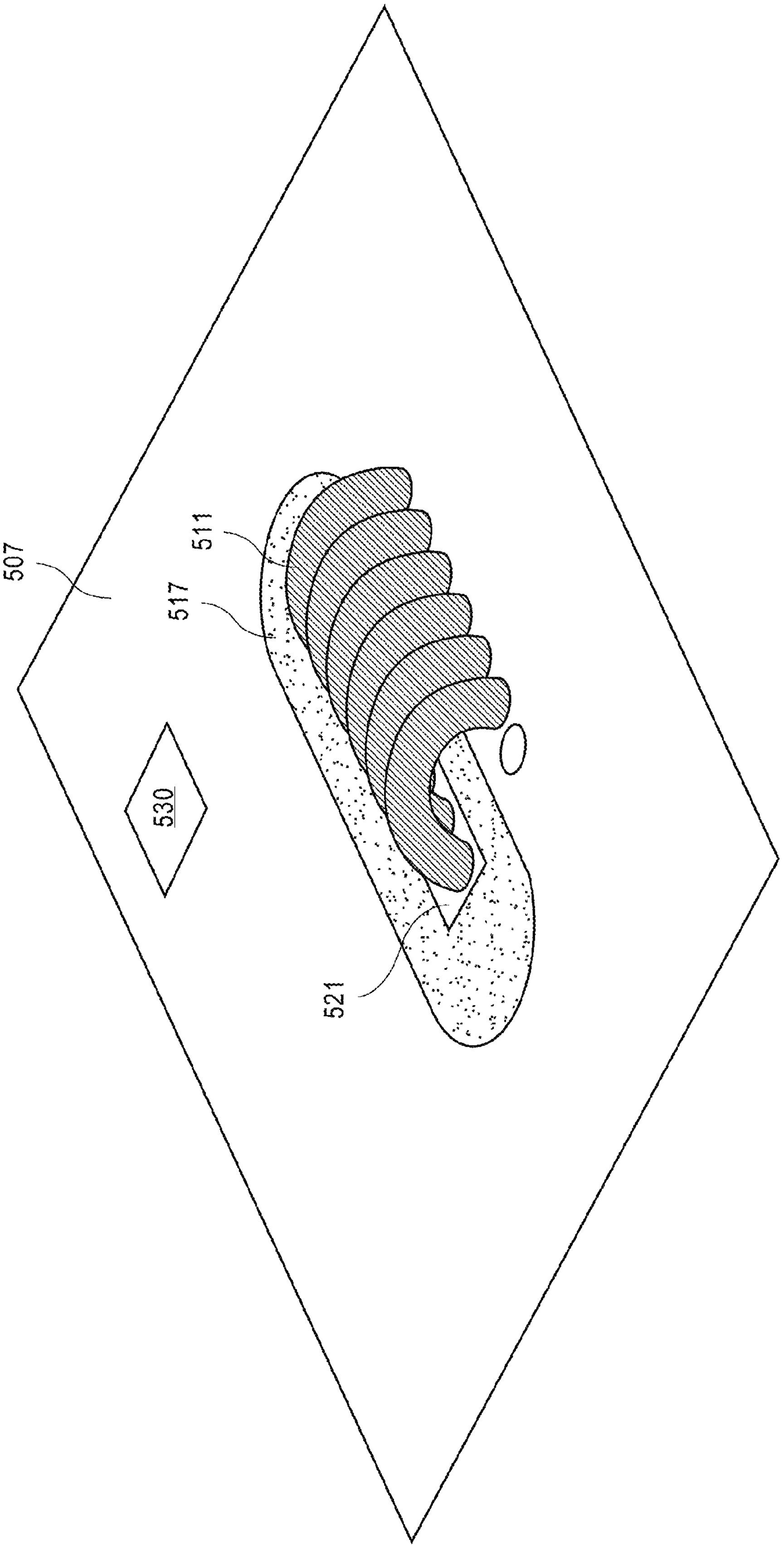

In FIG. 5D, a coil-like conducting wire structure above and below the package substrate 507 electrically connects the vias 511 (only one side of the package substrate 507 is shown). A first end-located conducting via is electrically connected (connection not shown), for example, to a voltage converter (not shown) and a second end-located conducting via is electrically connected (connection not shown), for example, to a chip 531. Typically, the voltage converter (not shown) operates at a frequency between 10 MHz and 500 MHz. The magnetic film 517 of FIGS. 5C-D is a single layer on non-linear magnetic material (e.g., similar to the film of the inductor of FIG. 1), or are multilayer magnetic films having orthogonal hard axes of magnetization (e.g., similar to the film of the inductor of FIGS. 3A and B).

In an embodiment of the invention, the substrate on which the magnetic layers are formed is comprised of silicon. The silicon substrate having magnetic layers is then transferred to the package substrate.

Inductor structures, such as the ones shown in FIGS. 1, 3A-B, and 5A-D are useful, for example, in functions such as power delivery to chips housed on package substrates.

Persons skilled in the relevant art appreciate that modifications and variations are possible throughout the disclosure and combinations and substitutions for various components shown and described. Reference throughout this specification to "one embodiment" or "an embodiment" means that a particular feature, structure, material, or characteristic described in connection with the embodiment is included in at least one embodiment of the invention, but does not necessarily denote that they are present in every embodiment. Furthermore, the particular features, structures, materials, or characteristics may be combined in any suitable manner in one or more embodiments. Various additional layers and/or structures may be included and/or described features may be omitted in other embodiments.

We claim:

1. A device comprising,
a substrate having a surface,
a magnetic film disposed on the substrate surface wherein the magnetic film has non-linear-magnetic properties, and
a plurality of conducting vias extending perpendicularly through the magnetic film that has non-linear magnetic properties wherein the plurality of conducting vias extend from a first face of the magnetic film that has non-linear magnetic properties to a second face of the magnetic film that has non-linear magnetic properties.

2. The device of claim 1 wherein the conducting vias do not make physical contact with the non-linear magnetic film.

3. The device of claim 1 wherein the conducting vias are disposed along a line.

4. The device of claim 1 wherein the non-linear magnetic film has two straight sides and two rounded sides.

5. The device of claim 4 wherein the rounded sides have a width that is greater than the width of the straight sides and the width of the rounded sides is at least 1.5 times as large as the width of the straight sides.

6. The device of claim 1 wherein the non-linear magnetic film has a thickness of between 0.20 μm and 50 μm.

7. The device of claim 1 wherein the substrate is comprised of silicon.

8. The device of claim 1 wherein the substrate is a packaging substrate and the substrate also includes an integrated circuit chip and voltage regulator and the conducting vias are electrically connected to the voltage regulator and the integrated circuit chip.

9. The device of claim 1 wherein the magnetic film is comprised of a material selected from the group consisting of CoZrTa, CoZrNb, CoZrTaN, CoFeHfO, CoPRe, CoPFeRe, NiFe, FeCo, CoZr, CoZrFe, CoZrTaB, and CoZrB.

10. The device of claim 1 wherein the magnetic film is comprised of a single layer of magnetic material.

11. A method for forming a device comprising,
providing a package substrate having a surface,
depositing a magnetic film on the package substrate surface wherein the magnetic film has non-linear-magnetic properties,
forming a plurality of conducting vias in the semiconductor package substrate,
so that in the resulting device the direction of current flow in the conducting vias is perpendicular to the plane of the non-linear magnetic film and the conducting vias extend through the magnetic film wherein the plurality of conducting vias extend from a first face of the magnetic film that has non-linear magnetic properties to a second face of the magnetic film that has non-linear magnetic properties.

12. The method of claim 11 wherein the conducting vias do not make physical contact with the non-linear magnetic film.

13. The method of claim 11 wherein the non-linear magnetic film is deposited on the package substrate surface in the presence of an alternating or rotating magnetic field.

14. The method of claim 11 wherein the resulting non-linear magnetic film has two straight sides and two rounded sides.

15. The method of claim 11 wherein the non-linear magnetic film is comprised of a material selected from the group consisting of CoZrTa, CoZrNb, CoZrTaN, CoFeHfO, CoPRe, CoPFeRe, NiFe, FeCo, CoZr, CoZrFe, CoZrTaB, and CoZrB.

16. A device comprising, a packaging substrate having a surface, a first anisotropic magnetic film disposed on the substrate surface, a second anisotropic magnetic film disposed on the substrate surface wherein the second anisotropic magnetic film is co-located with the first anisotropic magnetic film and wherein the first anisotropic magnetic film is at least 1.5 times as thick as the second anisotropic magnetic film, and a plurality of conducting vias extending perpendicularly through the anisotropic magnetic film.

17. The device of claim 16 wherein the first and second anisotropic magnetic layers have a hard axis of magnetization and the hard axis of magnetization of the first layer is perpendicular to the hard axis of magnetization of the second layer.

18. The device of claim 16 additionally comprising a third anisotropic magnetic layer and wherein the first, second, and third anisotropic magnetic layers each have different axes of magnetization.

19. The device of claim 16 wherein the conducting vias are disposed along a line.

20. The device of claim 16 wherein the first and second magnetic films have two straight sides and two rounded sides, wherein the rounded sides have a width that is greater than the width of the straight sides, and wherein the width of the rounded sides is at least 1.5 times as large as the width of the straight sides.

21. The device of claim 16 wherein the substrate also includes an integrated circuit chip and voltage regulator and the conducting vias are electrically connected to the voltage regulator and the integrated circuit chip.

22. The device of claim 21 wherein the voltage regulator is operating at a frequency of between 10 MHz and 500 MHz.

23. The device of claim 16 wherein the magnetic film is comprised of a material selected from the group consisting of CoZrTa, CoZrNb, CoZrTaN, CoFeHfO, CoPRe, CoPFeRe, NiFe, FeCo, CoZr, CoZrFe, CoZrTaB, and CoZrB.

24. The device of claim 16 wherein the ratio of the thicknesses of the first anisotropic magnetic film to the second anisotropic magnetic film is in the range of 2 to 1 to 6 to 1.

25. The device of claim 16 additionally comprising a third and fourth anisotropic magnetic layer and wherein the first, second, third, and fourth anisotropic magnetic layers each have a hard axis of magnetization and the hard axis of magnetization of the first layer is perpendicular to the hard axis of magnetization of the second layer and the hard axis of magnetization of the third layer is perpendicular to the hard axis of magnetization of the fourth layer.

26. A device comprising, a packaging substrate having a surface, a first anisotropic magnetic film disposed on the substrate surface, a second anisotropic magnetic film disposed on the substrate surface wherein the second anisotropic magnetic film is co-located with the first anisotropic magnetic film and wherein the first anisotropic magnetic film is at least 1.5 times as thick as the second anisotropic magnetic film, and an elongated conducting via extending perpendicularly through the anisotropic magnetic film wherein the conducting via is extended in a first dimension that is parallel to the plane of the magnetic film relative to a second dimension that is also parallel to the plane of the magnetic film.

27. The device of claim 26 wherein the substrate also includes an integrated circuit chip and voltage regulator and the conducting via is electrically connected to the voltage regulator and the integrated circuit chip.

28. The device of claim 26 wherein the ratio of the thicknesses of the first anisotropic magnetic film to the second anisotropic magnetic film is in the range of 2 to 1 to 6 to 1.

29. The device of claim 26 wherein the first and second anisotropic magnetic layers have a hard axis of magnetization and the hard axis of magnetization of the first layer is oriented in a different direction than the hard axis of magnetization of the second layer.

30. The device of claim 26 wherein the first and second anisotropic magnetic layers have a hard axis of magnetization and the hard axis of magnetization of the first layer is oriented in a different direction than the hard axis of magnetization of the second layer and the hard axis of magnetization of the first layer is oriented along the direction of elongation of the conducting via.

31. The device of claim 26 wherein the substrate also includes an integrated circuit chip and voltage regulator and the conducting via is electrically connected to the voltage regulator and the integrated circuit chip.

32. The device of claim 31 wherein the voltage regulator is operating at a frequency of between 10 MHz and 500 MHz.

33. A device comprising, a packaging substrate having a surface, at least one non-linear magnetic film disposed on the substrate surface, a plurality of conducting vias extending perpendicularly through the non-linear magnetic film, and a spiral conducting wire structure disposed on the substrate wherein a dimension of the spiral conducting wire structure at least partially overlaps with a dimension of the non-linear magnetic film wherein the plurality of conducting vias form part of the spiral conducting wire.

34. The device of claim 33 wherein the substrate also includes an integrated circuit chip and voltage regulator and the spiral conducting wire is electrically connected to the voltage regulator and the integrated circuit chip.

35. The device of claim 34 wherein the voltage regulator is operating at a frequency of between 10 MHz and 500 MHz.

* * * * *